United States Patent
Aimono

(10) Patent No.: US 9,893,263 B2
(45) Date of Patent: Feb. 13, 2018

(54) DRIVER FOR OPTICAL DEFLECTOR USING COMBINED SAW-TOOTH DRIVE VOLTAGE AND METHOD FOR CONTROLLING THE SAME

(71) Applicant: STANLEY ELECTRIC CO., LTD., Meguro-ku, Tokyo (JP)

(72) Inventor: Takanori Aimono, Tokyo-to (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 422 days.

(21) Appl. No.: 14/724,344

(22) Filed: May 28, 2015

(65) Prior Publication Data
US 2015/0349237 A1 Dec. 3, 2015

(30) Foreign Application Priority Data

Jun. 3, 2014 (JP) .................................. 2014-114759

(51) Int. Cl.
*H01L 41/09* (2006.01)
*H01L 41/107* (2006.01)
(Continued)

(52) U.S. Cl.
CPC ........ *H01L 41/042* (2013.01); *G02B 26/0858* (2013.01); *G02B 26/101* (2013.01); *G02B 26/105* (2013.01); *G09G 3/025* (2013.01)

(58) Field of Classification Search
USPC ....... 310/316.01, 317, 338; 359/200.8, 224.1
See application file for complete search history.

(56) References Cited

U.S. PATENT DOCUMENTS 8,730,549 B2 * 5/2014 Aimono ............... G02B 26/101
359/224.1
8,817,351 B2 * 8/2014 Koyama .............. G02B 26/101
359/200.8
(Continued)

FOREIGN PATENT DOCUMENTS

EP 2645148 A1 10/2013
JP 2008249797 A 10/2008
(Continued)

OTHER PUBLICATIONS

Extended European Search Report dated Oct. 9, 2015, issued in counterpart European Application No. 15170301.4.
(Continued)

*Primary Examiner* — Thomas Dougherty
(74) *Attorney, Agent, or Firm* — Holtz, Holtz & Volek PC

(57) ABSTRACT

In a driver for driving an optical deflector including a mirror, a piezoelectric actuator and a piezoelectric sensor adapted to sense vibrations of the piezoelectric actuator, a saw-tooth voltage generating unit; a combined saw-tooth voltage generating unit; and a control unit, the control unit applies a saw-tooth voltage and its inverted voltage to the piezoelectric actuator; performs a low-pass filtering process using a cut-off frequency upon a sense voltage; calculates a half period of fluctuations included in a low-pass-filtered saw-tooth voltage; combines the low-pass-filtered saw-tooth voltage with a delayed low-pass-filtered saw-tooth voltage; and to applies a combined saw-tooth voltage and its inverted voltage to the piezoelectric actuator.

12 Claims, 14 Drawing Sheets

(51) Int. Cl.
*H01L 41/113* (2006.01)
*G02B 26/08* (2006.01)
*H01L 41/04* (2006.01)
*G02B 26/10* (2006.01)
*G09G 3/02* (2006.01)

(56) References Cited

U.S. PATENT DOCUMENTS

| | | |
|---|---|---|
| 9,151,947 B2 * | 10/2015 | Aimono ................ G02B 26/08 |
| 2008/0239252 A1 | 10/2008 | Konno et al. |
| 2008/0297869 A1 | 12/2008 | Akiyama et al. |
| 2011/0109950 A1 | 5/2011 | Ito |
| 2012/0327494 A1 | 12/2012 | Koyama |
| 2013/0258432 A1 | 10/2013 | Aimono et al. |
| 2015/0043047 A1 | 2/2015 | Chikaoka |

FOREIGN PATENT DOCUMENTS

| | | |
|---|---|---|
| JP | 2008299297 A | 12/2008 |
| JP | 2009223165 A | 10/2009 |
| JP | 2013171226 A | 9/2013 |

OTHER PUBLICATIONS

Campbell, "An introduction to digital filters", University of Paisley; Sep. 25, 2007; "http://media.uws.ac.uk/~campbell/ASP/Lecture10/DigFiltIntro.PDF" * p. 6 *.

* cited by examiner

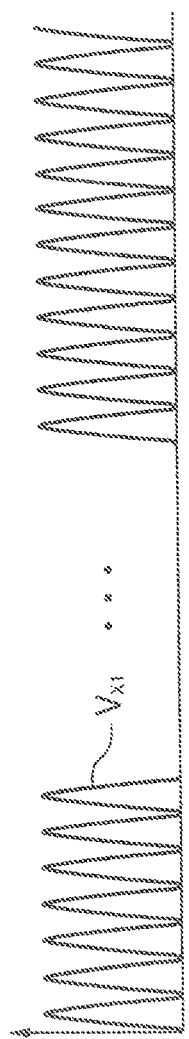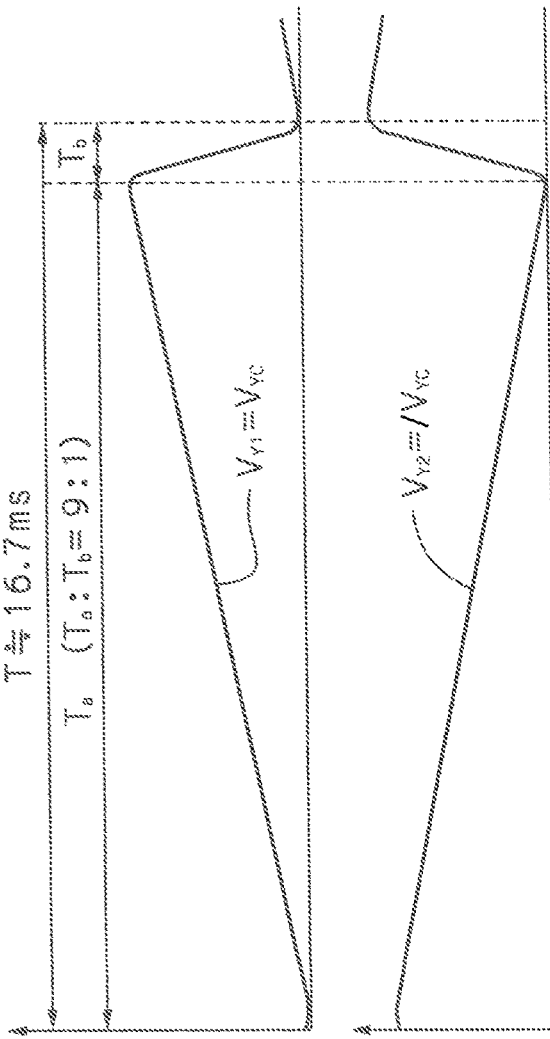
Fig. 3A
Fig. 3B
Fig. 3C
Fig. 3D

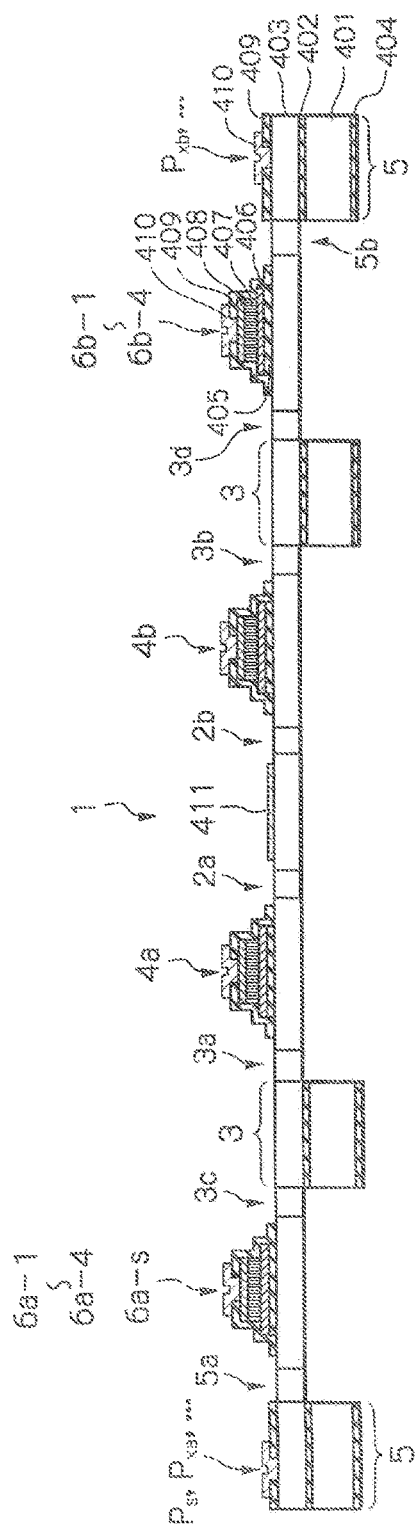

Fig. 7
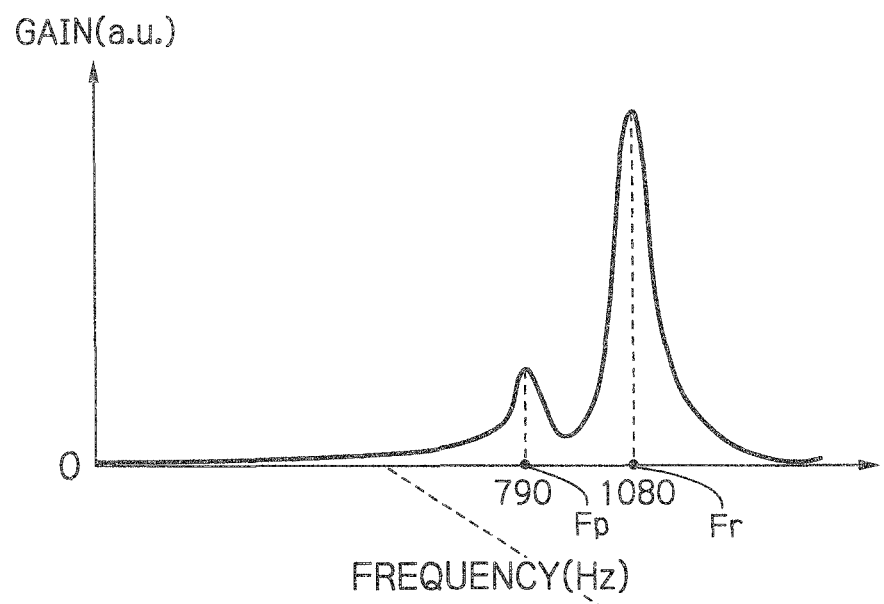
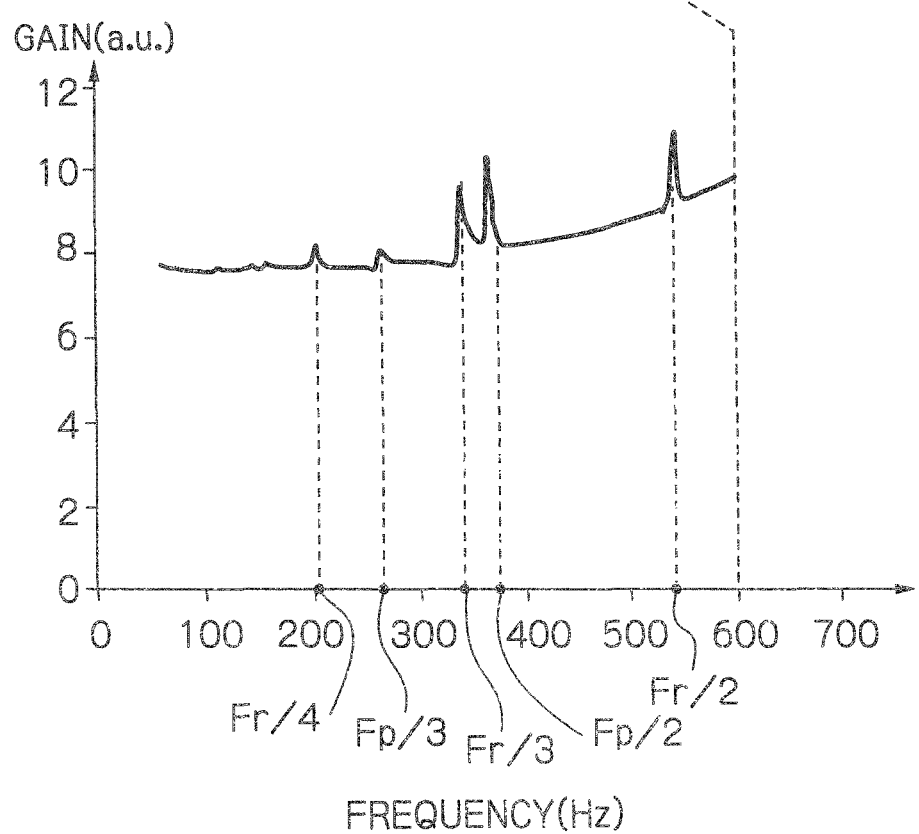

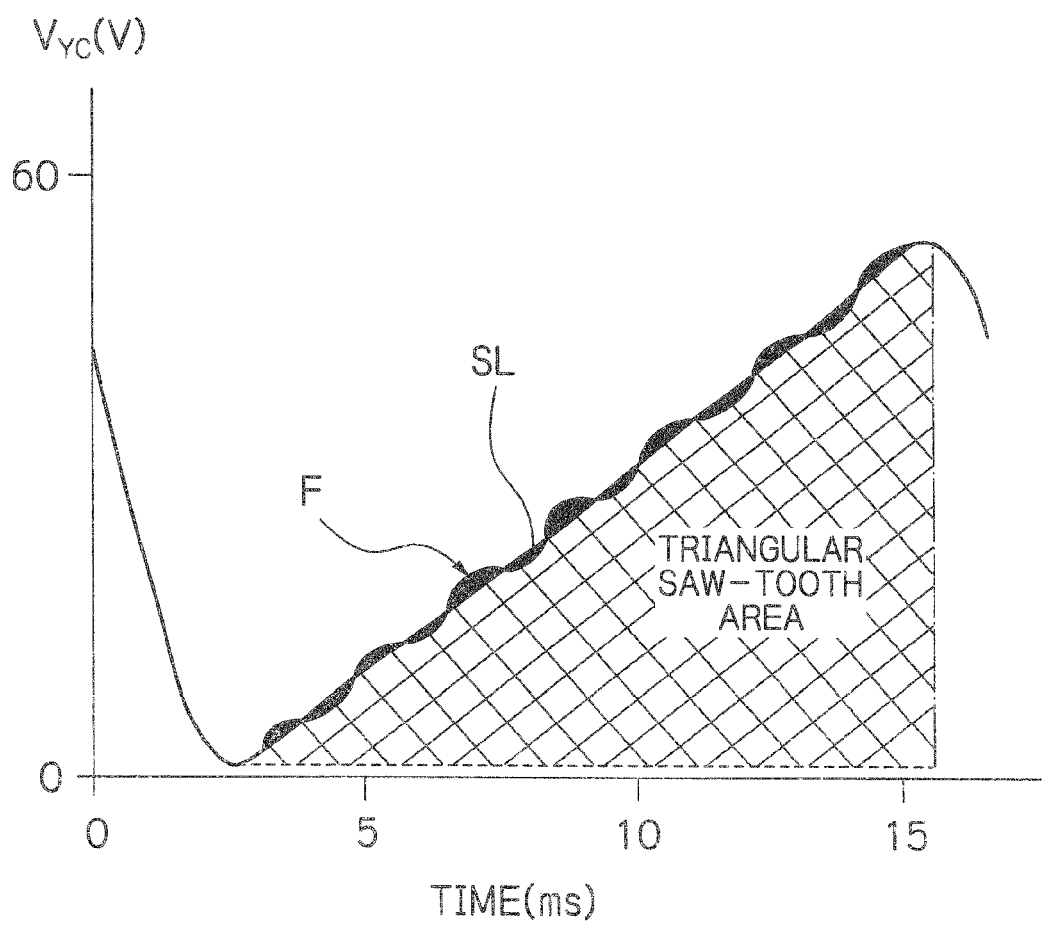

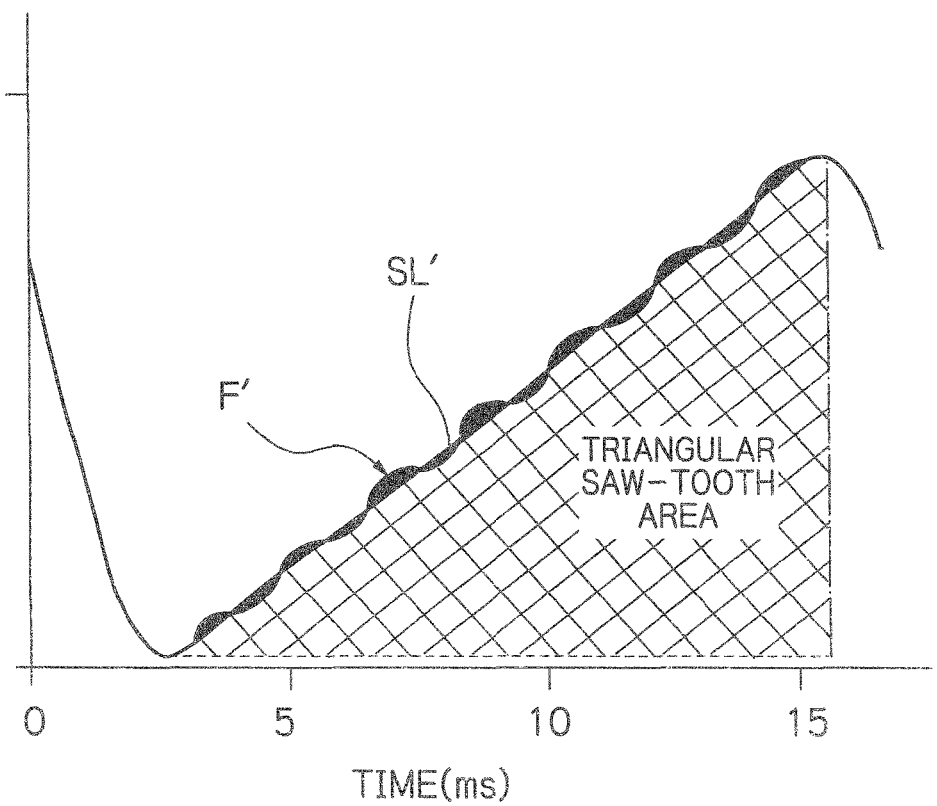

LOW-PASS-FILTERED SAW-TOOTH VOLTAGE

COMBINED SAW-TOOTH VOLTAGE

LOW-PASS-FILTERED SAW-TOOTH VOLTAGE

COMBINED SAW-TOOTH VOLTAGE

SINUSOIDAL- WAVE VOLTAGE

DRIVER FOR OPTICAL DEFLECTOR USING COMBINED SAW-TOOTH DRIVE VOLTAGE AND METHOD FOR CONTROLLING THE SAME

This application claims the priority benefit under 35 U. S. C. § 119 to Japanese Patent Application No. JP2014-114759 filed on Jun. 3, 2014, which disclosure is hereby incorporated in its entirety by reference.

BACKGROUND

Field

The presently disclosed subject relates to a driver for an optical deflector using a combined (synthesized) saw-tooth drive voltage and a method for controlling the optical deflector. The optical deflector can be applied as an optical scanner to a laser pico projector, a laser radar, a bar code reader, an area sensor, a head lamp, a head-up display unit, and other optical apparatuses, to generate scanning light.

Description of the Related Art

Generally, in an optical scanner or the like, an optical deflector is constructed by a micro electro mechanical system (MEMS) device manufactured by using semiconductor manufacturing processes and micro machine technology.

A first prior art optical deflector as a two-dimensional MEMS device is constructed by a mirror, a pair of torsion bars coupled to the mirror along an axis (X-axis), an inner frame (movable frame) surrounding the mirror and the torsion bars, inner piezoelectric actuators coupled between the torsion bars and supported by the inner frame via inner coupling portions, serving as cantilevers for rocking the mirror with respect to the X-axis of the mirror, an outer frame (fixed frame) surrounding the inner frame, and outer piezoelectric actuators coupled between the inner frame and the outer frame, serving as cantilevers for rocking the mirror along another axis (Y-axis) of the mirror (see: JP2009-223165A).

Generally, the inner piezoelectric actuators are driven by a relatively high frequency such as 20 kHz for a horizontal scanning, while the outer piezoelectric actuators are driven by a relatively low frequency such as 60 Hz for a vertical scanning. For example, the inner piezoelectric actuators rock the mirror through the torsion bars, so that the inner piezoelectric actuators are driven by two synchronous sinusoidal-wave drive voltages. On the other hand, the outer piezoelectric actuators rock the mirror without torsion bars, so that the outer piezoelectric actuators are driven by two synchronous saw-tooth drive voltages which have a ratio of arising period (falling period) to a falling period (rising period) of 9:1 so as to exhibit longer linearly-changed drive voltages.

However, the synchronous saw-tooth drive voltages include harmonic frequency components in addition to their fundamental frequency such as 60 Hz. Therefore, even when the fundamental frequency of the synchronous saw-tooth drive voltages is smaller than a main natural (resonant) frequency Fr such as 1080 Hz and a pumping natural (resonant) frequency Fp such as 790 Hz of a mechanically-vibrating system of the mirror depending upon the structure of the outer piezoelectric actuators, the fundamental frequency would be superposed onto the above-mentioned harmonic frequency components. Note that the main natural frequency Fr is with respect to the Y-axis of the mirror, while the pumping natural frequency is with respect to a Z-axis perpendicular to the X-axis and the Y-axis. Therefore, the mirror would fluctuate due to the higher-order harmonic frequencies of the main natural frequency Fr and the pumping natural frequency Fp. As a result, a higher frequency vibration would be superimposed onto the rocking of the mirror, so that the scanning speed would fluctuate to cause distortion of an image.

A second prior art optical deflector as a one-dimensional MEMS device is constructed by a mirror, a supporting member, an oscillation axis coupled between the supporting member and the mirror, and oscillation members coupled to the oscillation axis (see: US2008/0297869A1 & JP2008-299297). A driver synthesizes a plurality of rectangular pulse voltages corresponding to a plurality of natural frequencies to form a rectangular pulse drive voltage which may be a saw-tooth or triangular wave drive voltage (see: paragraph 0036 of US2008/0297869A1 & paragraph 0014 of JP2008-299297).

Even in the above-described second prior art optical deflector, when the saw-tooth wave drive voltage synthesized by the plurality of natural frequencies is applied to the oscillation members, the mirror would fluctuate due to the harmonic components of the natural frequencies such as Fr and Fp.

A third prior art optical deflector as a two-dimensional MEMS device is constructed by a mirror, an inner frame (movable frame) surrounding the mirror through a pair of torsion bars, an outer frame (fixed frame), and four piezoelectric actuators fixed between the inner frame and serving as cantilevers for two-dimensionally rocking the mirror along the X-axis (horizontal direction) and the Y-axis (vertical direction) (see: FIG. 2 of US2008/0239252A and JP2008-249797A). Even in this third prior art optical deflector, the piezoelectric actuators are driven by a sinusoidal-wave voltage for a horizontal scanning, and the piezoelectric actuators are driven by a saw-tooth wave voltage for a vertical scanning. In the latter scanning, in order to correct distortion in an image along the Y-axis (vertical direction), a harmonic suppressing unit is provided to remove the higher harmonic components from the saw-tooth drive voltages for the vertical direction to obtain non-linear saw-tooth drive voltages for a vertical direction to be applied to the piezoelectric actuators (see: FIGS. 6C and 7 of US2008/0239252A and JP2008-249797A). For example, the range of the order of higher harmonic components to be removed may be 10 times or larger than the fundamental frequency (see: paragraph 147 of US2008/0239252A & paragraph 118 of JP2008-249797A).

In the above-described third prior art optical deflector, if the fundamental frequency of the vertical direction is 60 Hz, the harmonic components higher than 600 Hz are removed from the saw-tooth drive voltages for a vertical direction. However, the distortion along the Y-axis (in the vertical direction) is actually caused by higher-order harmonic components such as 540 Hz, 360 Hz, . . . of the main natural frequency Fr=1080 Hz and higher-order harmonic components such as 395 Hz, 263 Hz, . . . of the pumping natural frequency Fp=790 Hz. Therefore, it is impossible to completely remove the fluctuations.

A fourth prior art optical deflector as a two-dimensional MEMS device is constructed by a mirror, an inner frame coupled via inner torsion bars to the mirror, and an outer frame coupled via outer torsion bars to the inner frame. The mirror is electromagnetically driven by a sinusoidal-wave drive voltage having a relatively high frequency, and also, is electromagnetically driven by a saw-tooth wave drive voltage having a relatively low frequency such as 60 Hz. In this case, the saw-tooth wave drive voltage is synthesized with another saw-tooth wave drive voltage by shifting a phase of 1/(2·Fr) where Fr is a natural (resonant) frequency, so that unnecessary oscillations caused by the natural frequency are suppressed (see: US2015/0043047A1 & JP2013-171226A).

In the above-described fourth prior art optical deflector, however, the fluctuations along the Y-axis (in the vertical direction) are actually caused by higher-order harmonic components such as 540 Hz, 360 Hz, . . . of the main natural frequency Fr=1080 Hz and higher-order harmonic components such as 395 Hz, 263 Hz, . . . of the pumping natural frequency Fp=790 Hz. Therefore, it is impossible to completely remove the fluctuations from the vibration of the mirror.

SUMMARY

The presently disclosed subject matter seeks to solve the above-described problems.

According to the presently disclosed subject matter, in an optical deflector for driving an optical deflector including a mirror, a piezoelectric actuator adapted to rock the mirror around a first axis of the optical deflector and a piezoelectric sensor adapted to sense vibrations of the piezoelectric actuator, a saw-tooth voltage generating unit adapted to generate a saw-tooth voltage; a combined saw-tooth voltage generating unit adapted to generate a combined saw-tooth voltage; and a control unit adapted to control the saw-tooth voltage generating unit and the combined saw-tooth voltage generating unit to receive a sense voltage from the piezoelectric sensor, the control unit operates the saw-tooth voltage generating unit to apply the saw-tooth voltage and its inverted voltage to the piezoelectric actuator to receive the sense voltage from the piezoelectric sensor; performs a low-pass filtering process using a cut-off frequency upon the sense voltage to obtain a low-pass-filtered saw-tooth voltage; calculates a half period of fluctuations included in the low-pass-filtered saw-tooth voltage; combines the low-pass-filtered saw-tooth voltage with a delayed low-pass-filtered saw-tooth voltage obtained by delaying the low-pass-filtered saw-tooth voltage by the half period, to obtain a combined saw-tooth voltage; and operates the combined saw-tooth voltage generating unit to apply the combined saw-tooth voltage and its inverted voltage to the piezoelectric actuator.

Also, in a method for controlling an optical deflector including a mirror, a piezoelectric actuator adapted to rock the mirror around a first axis of the optical deflector and a piezoelectric sensor adapted to sense vibrations of the piezoelectric actuator, a saw-tooth voltage and its inverted voltage are applied to the piezoelectric actuator to receive the sense voltage from the piezoelectric sensor. Then, a low-pass filtering process using a cut-off frequency is performed upon the sense voltage to obtain a low-pass-filtered saw-tooth voltage. Then, a half period of fluctuations included in the low-pass-filtered saw-tooth voltage is calculated. Then, the low-pass-filtered saw-tooth voltage is combined with a delayed low-pass-filtered saw-tooth voltage obtained by delaying the low-pass-filtered saw-tooth voltage by the half period, to obtain a combined saw-tooth voltage. Finally, the combined saw-tooth voltage and its inverted voltage are applied to the piezoelectric actuator.

According to the presently disclosed subject matter, since the combined (synthesized) saw-tooth voltage applied to the piezoelectric actuator has no substantial fluctuations, the fluctuations can substantially be removed from the vibration of the mirror.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIGS. 3A, 3B, 3C and 3D are timing diagrams of the drive voltages applied to the piezoelectric actuators of FIG. 1;

FIG. 4 is a cross-sectional view of the optical deflector of FIG. 1;

FIG. 7 is a frequency spectrum of the sense voltage of FIG. 5, when a search sinusoidal-wave voltage is applied to the piezoelectric actuators of FIG. 1;

FIG. 9 is an enlargement of the timing diagram of FIG. 8E;

FIG. 10 is a timing diagram of the sense voltage when the combined saw-tooth voltage of FIG. 8E is applied to the piezoelectric actuators of FIG. 1;

DETAILED DESCRIPTION OF EXEMPLARY EMBODIMENTS

Figure 1:
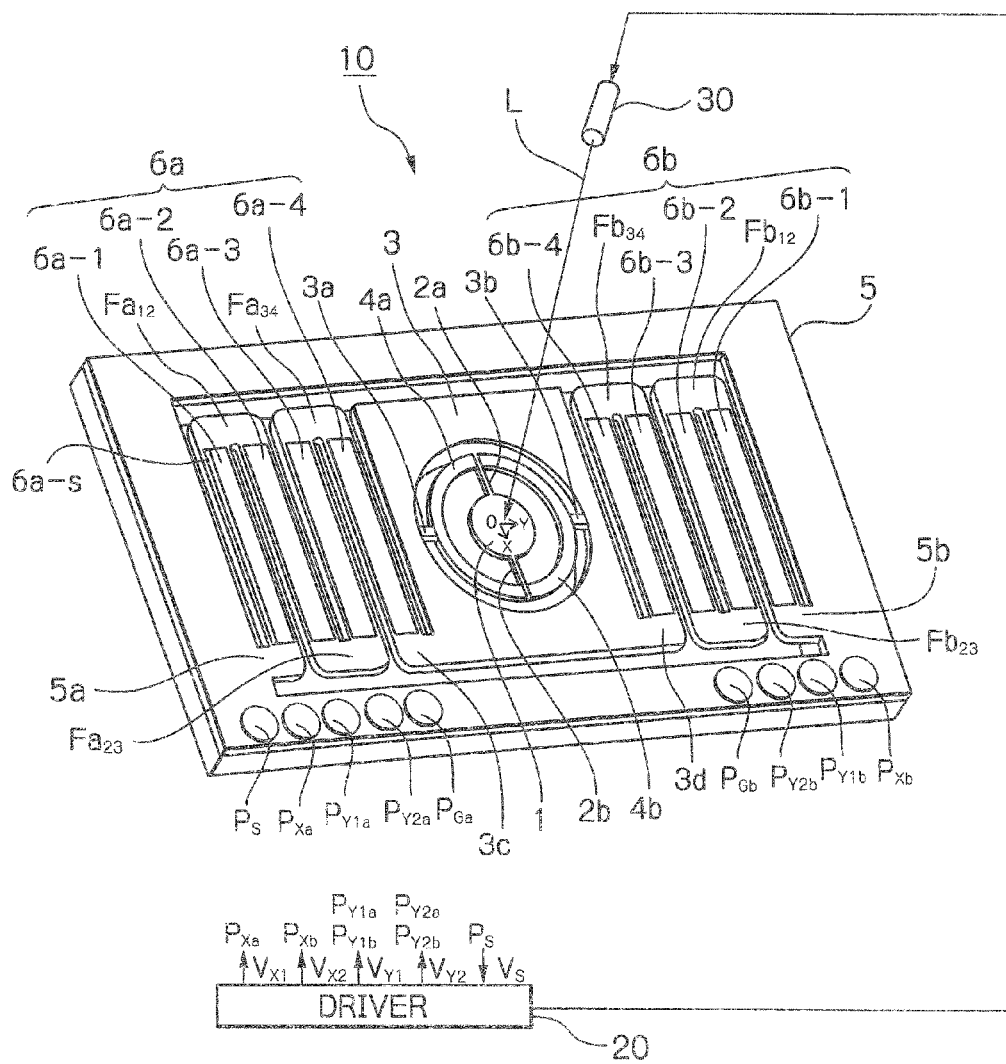
FIG. 1 is a front-side perspective view illustrating an embodiment of the optical deflector according to the presently disclosed subject matter.

In FIG. 1, which illustrates an embodiment of the optical deflector according to the presently disclosed subject matter as a two-dimensional MEMS device, reference numeral 10 designates a two-dimensional optical deflector, 20 designates a driver for driving the optical deflector 10, and 30 designates a laser light source.

The optical deflector 10 is constructed by a circular mirror 1 for reflecting incident light L from the laser light source 30, a pair of torsion bars 2a and 2b coupled to the mirror 1 along an X-axis, an inner frame (movable frame) 3 surrounding the mirror 1 and the torsion bars 2a and 2b for supporting the mirror 1, a semi-ring shaped inner piezoelectric actuator 4a coupled between the torsion bars 2a and 2b and supported by an inner coupling portion 3a of the inner frame 3, and a semi-ring shaped inner piezoelectric actuator 4b coupled between the torsion bars 2a and 2b and supported by an inner coupling portion 3b of the inner frame 3. In this case, the inner frame 3 has a circular inner circumference along the inner piezoelectric actuators 4a and 4b, and a rectangular outer circumference. The flexing direction of the inner piezoelectric actuator 4a is opposite to that of the inner piezoelectric actuator 4b, so that the inner piezoelectric actuators 4a and 4b serve as cantilevers for rocking the mirror 1 around the X-axis.

Also, the optical deflector 10 includes an outer frame (fixed frame) 5 and a pair of meander-type outer piezoelectric actuators 6a and 6b coupled between coupling portions 5a and 5b of the outer frame 5 and outer coupling portions 3c and 3d of the inner frame 3 and serving as cantilevers for rocking the mirror 1 around a Y-axis on the plane of the mirror 1 centered at the center 0 of the mirror 1. The outer piezoelectric actuators 6a and 6b are arranged opposite to each other with respect to the mirror 1.

The mirror 1 can be square, rectangular, polygonal or elliptical. In this case, the inner-circumference of the inner frame 3 is adapted to the shape of the mirror 1.

In more detail, the torsion bars 2a and 2b have ends coupled to the outer circumference of the mirror 1 and other ends coupled to the inner circumference of the inner frame 3. Therefore, the torsion bars 2a and 2b are twisted by the inner piezoelectric actuators 4a and 4b to rock the mirror 1 around the X-axis.

The outer frame 5 is rectangular-framed to surround the inner frame 3 associated with the meander-type outer piezoelectric actuators 6a and 6b.

The meander-type outer piezoelectric actuator 6a is constructed by piezoelectric cantilevers 6a-1, 6a-2, 6a-3 and 6a-4 which are serially-coupled from the coupling portion 5a of the outer frame 5 to the coupling portion 3c of the inner frame 3 via folded portions $Fa_{12}$, $Fa_{23}$ and $Fa_{34}$. Also, each of the piezoelectric cantilevers 6a-1, 6a-2, 6a-3 and 6a-4 is in parallel with the X-axis. Therefore, the piezoelectric cantilevers 6a-1, 6a-2, 6a-3 and 6a-4 are folded at their ends or meandering from the outer frame 5 to the inner frame 3, so that the amplitudes of the piezoelectric cantilevers 6a-1, 6a-2, 6a-3 and 6a-4 can be changed along directions perpendicular to the Y-axis.

A piezoelectric sensor 6a-s is incorporated into the outermost piezoelectric cantilever 6a-1 of the meander-type outer piezoelectric actuator 6a to detect a sense deflection angle of the mirror 1 along the Y-direction.

Similarly, the meander-type outer piezoelectric actuator 6b is constructed by piezoelectric cantilevers 6b-1, 6b-2, 6b-3 and 6b-4 which are serially-coupled from the coupling portion 5b of the outer frame 5 to the outer coupling portion 3d of the inner frame 3 via folded portions $Fb_{12}$, $Fb_{23}$ and $Fb_{34}$. Also, each of the piezoelectric cantilevers 6b-1, 6b-2, 6b-3 and 6b-4 are in parallel with the X-axis. Therefore, the piezoelectric cantilevers 6b-1, 6b-2, 6b-3 and 6b-4 are folded at their ends or meandering from the outer frame 5 to the inner frame 3, so that the piezoelectric cantilevers 6b-1, 6b-2, 6b-3 and 6b-4 can be changed along directions perpendicular to the Y-axis.

The meander-type outer piezoelectric actuators 6a (6b) operate as follows.

In the outer piezoelectric actuators 6a (6b), the piezoelectric cantilevers 6a-1, 6a-2, 6a-3 and 6a-4 (6b-1, 6b-2, 6b-3 and 6b-4) are divided into an odd-numbered group of the piezoelectric cantilevers 6a-1 and 6a-3 (6b-1 and 6b-3), and an even-numbered group of the piezoelectric cantilevers 6a-2 and 6a-4 (6b-2 and 6b-4) alternating with the odd-numbered group of the piezoelectric cantilevers 6a-1 and 6a-3 (6b-1 and 6b-3).

Figure 2A:
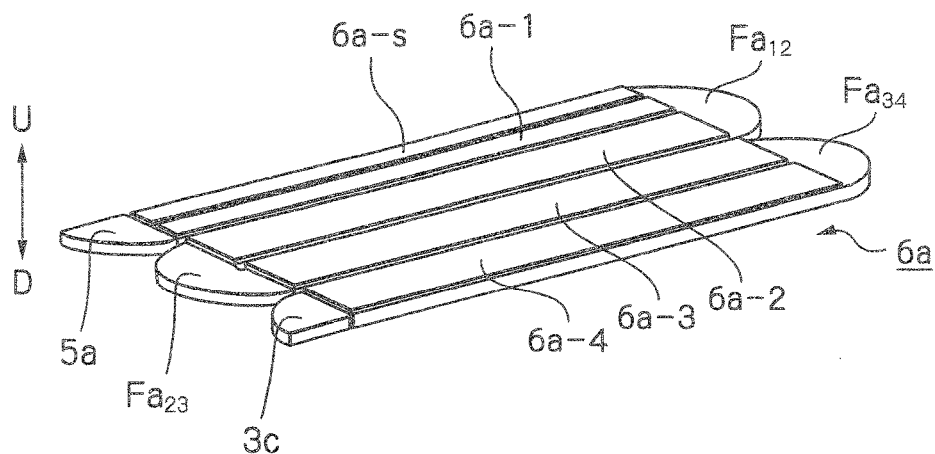
FIGS. 2A and 2B are views for explaining the operation of the outer piezoelectric actuators of FIG. 1.
Figure 2B:
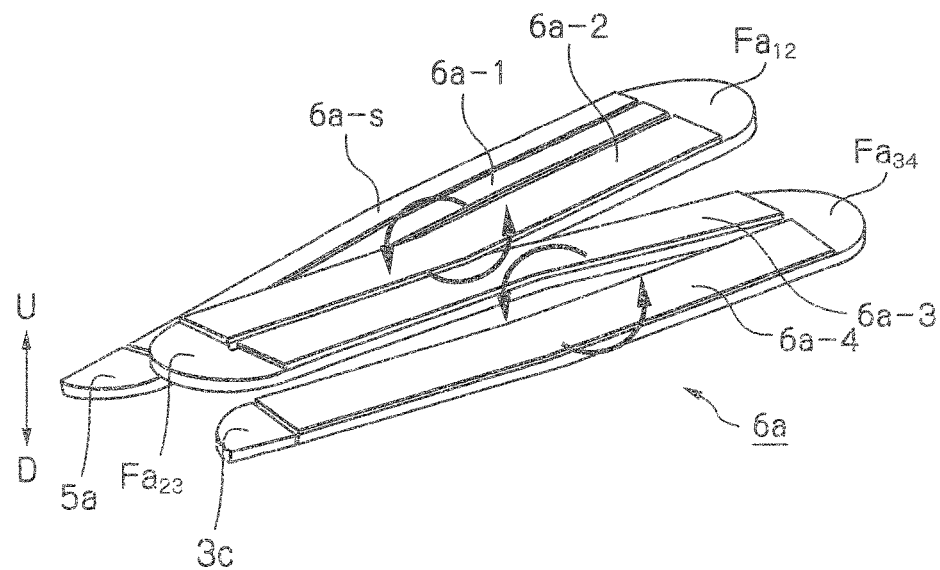

When no drive voltages are applied to the piezoelectric cantilevers 6a-1, 6a-2, 6a-3 and 6a-4, the piezoelectric cantilevers 6a-1, 6a-2, 6a-3 and 6a-4 as well as the piezoelectric sensor 6a-s are illustrated in FIG. 2A.

On the other hand, a first drive voltage is applied to the odd-numbered group of the piezoelectric cantilevers 6a-1 and 6a-3 and a second drive voltage opposite in phase to the first drive voltage is applied to the even-numbered group of the piezoelectric cantilevers 6a-2 and 6a-4. For example, the odd-numbered group of the piezoelectric cantilevers 6a-1 and 6a-3 are flexed in one direction, for example, in an upward direction U, and the even-numbered group of the piezoelectric cantilevers 6a-2 and 6a-4 are flexed in the other direction, i.e., in a downward direction D. Otherwise, the odd-numbered group of the piezoelectric cantilevers 6a-1 and 6a-3 are flexed in the downward direction D, and the even-numbered group of the piezoelectric cantilevers 6a-2 and 6a-4 are flexed in the upward direction U. In this case, if the length of each of the piezoelectric cantilevers 6a-1 and 6a-4 is about half of that of each of the piezoelectric cantilevers 6a-2 and 6a-3, the flexing amounts of the piezoelectric cantilevers 6a-1 and 6a-4 are about half of those of the piezoelectric cantilevers 6a-2 and 6a-3.

Thus, the mirror 1 is rocked around the Y-axis.

The flexing amount of the piezoelectric actuator 6a is sensed by the piezoelectric sensor 6a-s incorporated into the piezoelectric actuator 6a.

Note that the number of piezoelectric cantilevers in each of the outer piezoelectric actuators 6a and 6b can be other values such as 3, 5, 6, 7, . . . .

Provided on the outer frame 5 are pads $P_s$, $P_{Ga}$, $P_{Xa}$, $P_{Y1a}$, $P_{Y2a}$, $P_{Gb}$, $P_{Xb}$, $P_{Y1b}$, and $P_{Y2}b$ which are connected to the driver 20. The driver 20 applies a drive voltage $V_{X1}$ as illustrated in FIG. 3A to the pad $P_{Xa}$ and applies a drive voltage $V_{X2}$ as illustrated in FIG. 3B to the pad $P_{Xb}$. The drive voltages $V_{X1}$ and $V_{X2}$ are sinusoidal, and the drive voltage $V_{X1}$ is opposite in phase to the drive voltage $V_{X2}$. For example, the frequency $f_X$ of the drive voltages $V_{X1}$ and $V_{X2}$ is one resonant frequency $f_{rX}$ as 20 kHz depending upon a resonant structure formed by the mirror 1, the torsion bars 2a and 2b and the inner piezoelectric actuators 4a and 4b. On the other hand, the driver 20 applies a drive voltage $V_{Y1}$ as illustrated in FIG. 3C to the pads $P_{Y1}a$ and $P_{Y1b}$, and applies a drive voltage $V_{Y2}$ as illustrated in FIG. 3D to the pads $P_{Y2}a$ and $P_{Y2b}$. The drive voltages $V_{Y1}$ and $V_{Y2}$ are a combined (synthesized) saw-tooth voltage $V_{YC}$ and its inverted voltage /$V_{YC}$ with no substantial fluctuations, and the drive voltage $V_{Y1}$ is opposite in phase to the drive voltage $V_{Y2}$. For example, the frequency $f_Y$ of the drive voltages $V_{Y1}$ and $V_{Y2}$ is 60 Hz, much lower than the resonant frequency $f_{rX}$. The combined (synthesized) saw-tooth voltage $V_{YC}$ be explained later in detail.

The pad $P_{Ga}$, which is grounded, is connected via a via-structure (not shown) to the lower electrode layers 406 (see: FIG. 4) of the inner piezoelectric actuator 4a and the piezoelectric cantilevers 6a-1, 6a-2, 6a-3 and 6a-4 of the outer piezoelectric actuator 6a.

The pad $P_{Xa}$ is connected via a wiring layer (not shown) to the upper electrode layers 408 (see: FIG. 4) of the inner piezoelectric actuator 4a.

The pad $F_{Y1}a$ is connected via a wiring layer (not shown) to the upper electrode layers 408 (see: FIG. 4) of the odd-numbered piezoelectric cantilevers 6a-1 and 6a-3 of the outer piezoelectric actuator 6a.

The pad $P_{Y2}a$ is connected via a wiring layer (not shown) to the upper electrode layers 408 (see: FIG. 4) of the even-numbered piezoelectric cantilevers 6a-2 and 6a-4 of the outer piezoelectric actuator 6a.

The pad $P_{Gb}$, which is grounded, is connected via a via-structure (not shown) to the lower electrode layers 406 (see: FIG. 4) of the inner piezoelectric actuator 4b and the piezoelectric cantilevers 6b-1, 6b-2, 6b-3 and 6b-4 of the outer piezoelectric actuator 6b.

The pad $P_{Y2}b$ is connected via a wiring layer (not shown) to the upper electrode layers 408 (see: FIG. 4) of the inner piezoelectric actuator 4b.

The pad $P_{Y1}b$ is connected via a wiring layer (not shown) to the upper electrode layers 408 (see: FIG. 4) of the odd-numbered piezoelectric cantilevers 6b-1 and 6b-3 of the outer piezoelectric actuator 6b.

The pad $P_{Y2}b$ is connected via a wiring layer (not shown) to the upper electrode layers 408 (see: FIG. 4) of the even-numbered piezoelectric cantilevers 6b-2 and 6b-4 of the outer piezoelectric actuator 6b.

The pad $P_s$ is connected via a wiring layer (not shown) to the upper electrode layers 408 (see: FIG. 4) of the piezoelectric sensor 6a-s.

A method for manufacturing the optical deflector of FIG. 4 is explained below.

First, a silicon-on-insulator (SOI) structure constructed by a monocrystalline silicon support layer ("Handle" layer) 401, an intermediate (buried) silicon dioxide layer ("Box" layer) 402, and a monocrystalline silicon active layer ("Device" layer) 403 is prepared. Also, by a thermal oxidation process, a silicon dioxide layer 404 is formed on the support layer 401, and a silicon dioxide layer 405 is formed on the active layer 403. Further, piezoelectric actuator cantilevers 4a, 4b, 6a-1, 6a-2, 6a-3 and 6a-4, 6b-1, 6b-2, 6b-3 and 6b-4 and the piezoelectric sensor 6a-s are formed on the active layer 403, as will be explained below.

Next, a Pt/Ti lower electrode layer 406 consisting of an about 50 nm thick Ti and an about 150 nm thick Pt on Ti is formed by a sputtering process. Then, an about 3 μm thick PZT layer 407 is deposited on the lower electrode layer 406 by an arc discharge reactive ion plating (ADRIP) process at a temperature of about 500° C. to 600° C. Then, an about 150 nm thick Ti upper electrode layer 408 is formed on the PZT layer 407 by a sputtering process.

Next, the upper electrode layer 408 and the PZT layer 407 are patterned by a photolithography and etching process. In this case, the upper electrode layer 408 of the piezoelectric sensor 6a-s is electrically isolated from the upper electrode layer 408 of the piezoelectric cantilever 6a-1. Otherwise, the upper electrode layer 408 and the PZT layer 407 of the piezoelectric sensor 6a-s are electrically isolated from the upper electrode layer 408 and the PZT layer 40.7 of the piezoelectric cantilever 6a-1. Then the lower electrode layer 406 and the silicon dioxide layer 405 are patterned by a photolithography and etching process.

Next, an about 500 nm thick silicon dioxide interlayer 409 is formed on the entire surface by a plasma chemical vapor deposition (CVD) process.

Next, contact holes are perforated in the silicon dioxide interlayer 409 by a photolithography and dry etching process. The contact holes correspond to the piezoelectric sensor 6a-s, the piezoelectric actuators 4a and 4b, the piezoelectric cantilevers 6a-1, 6a-2, 6a-3, 6a-4, 6b-1, 6b-2, 6b-3, 6b-4, the pads $P_s$, $P_{Xa}$, $P_{Y1a}$, $P_{Y2a}$, $P_{Ga}$, $P_{Xb}$, $P_{Y1b}$, $P_{Y2b}$, and $P_{Gb}$.

Next, wiring layers 410 made of AlCu (1%Cu) are formed by a photolithography process, a sputtering process, and a lift-off process. The wiring layers 410 are electrically connected between the upper electrode layers 408 of the piezoelectric actuators 4a and 4b, the piezoelectric sensor 6a-s, and the piezoelectric cantilevers 6a-1, 6a-2, 6a-3, 6a-4, 6b-1, 6b-2, 6b-3 and 6b-4 and their corresponding pads $P_s$, $P_{Xa}$, $P_{Y1a}$, $P_{Y2a}$, $P_{Ga}$, $P_{Xb}$, $P_{Y1b}$, $P_{Y2b}$, and $P_{Gb}$.

Next, the silicon dioxide layer 404 is etched by a photolithography and dry etching process, so that the silicon dioxide layer 404 is left in an area corresponding to the inner frame 3 and the outer frame 5.

Next, the support layer 401 is etched by a dry etching process using the silicon dioxide layer 404 as an etching mask. Then, the silicon dioxide layer 402 is etched by a wet etching process using the support layer 401 as an etching mask.

Finally, an aluminum (Al) reflective metal layer 411 is formed by an evaporation process on the active layer 403, and is patterned by a photolithography and etching process, thus completing the optical deflector.

In FIG. 4, the torsion bars 2a and 2b are formed by the active layer 403.

Figure 5:
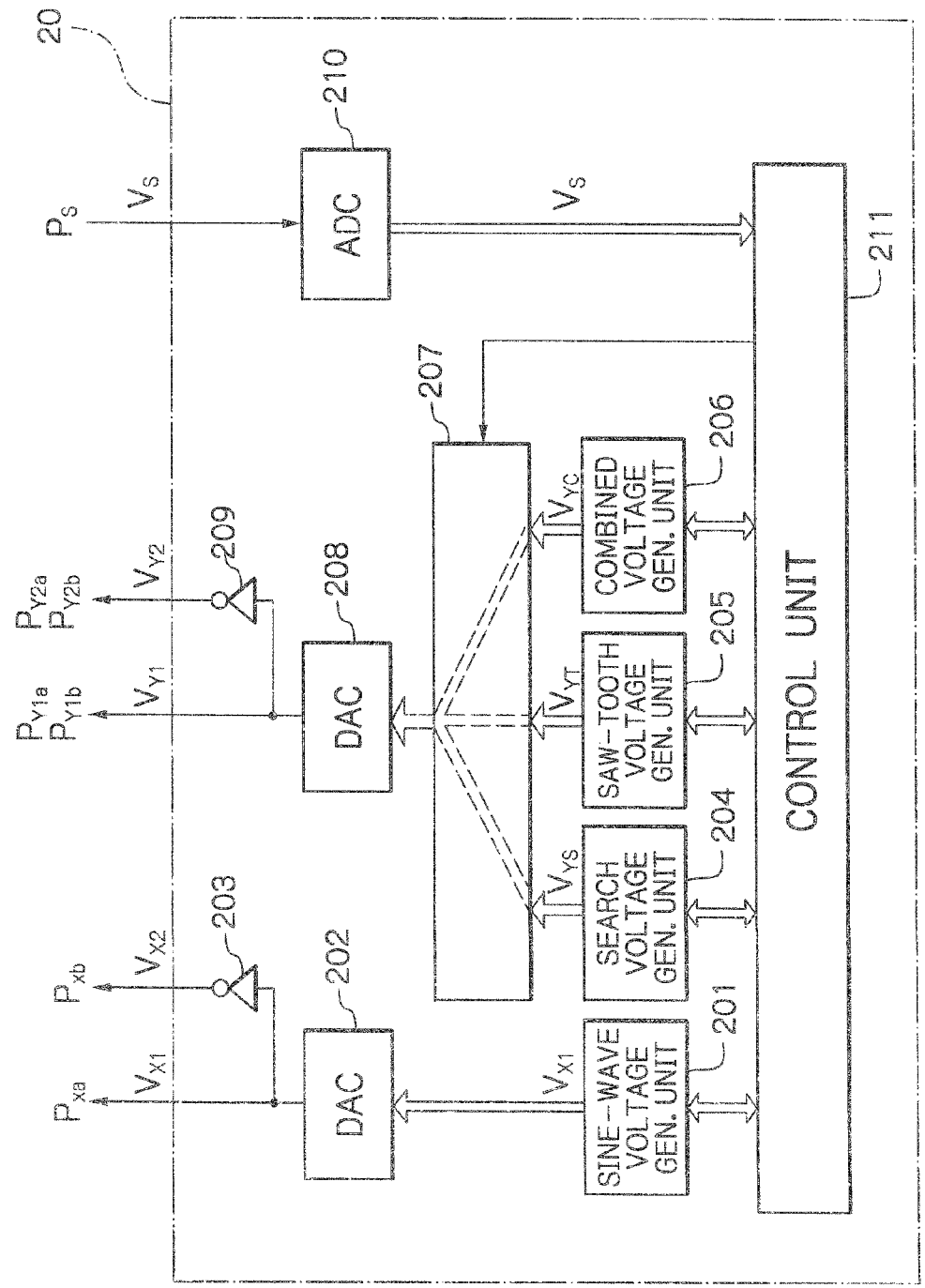
FIG. 5 is a block circuit diagram of the driver of FIG. 1.

In FIG. 5, which is a detailed block circuit diagram of the driver 20 of FIG. 1, the driver 20 is constructed by a sinusoidal-wave voltage generating unit 201 for generating a digital sinusoidal-wave drive voltage $V_{X1}$ a resonant frequency of 20 kHz and a peak-to-peak voltage of 60V, a digital-to-analog converter 202 for converting the digital sinusoidal-wave drive voltage $V_{X1}$ into an analog sinusoidal-wave drive voltage $V_{X1}$ the pad $P_{xa}$, and an inverter 203 for generating its inverted analog sinusoidal-wave drive voltage $V_{X2}$ for the pad $P_{xb}$. The sinusoidal-wave generating unit 201 includes a memory such as a nonvolatile memory for storing the digital sinusoidal-wave drive voltage $V_{X1}$. Note that the denotations of the analog drive voltages are the same as those of their corresponding digital drive voltages in order to simplify the description.

Also, the driver 20 is constructed by a search sinusoidal-wave voltage generating unit 204 for generating a digital search sinusoidal-wave voltage $V_{YS}$ having a frequency between 1 Hz and 2 kHz and a peak-to-peak voltage of 2V, a saw-tooth generating unit 205 for generating a digital saw-tooth voltage $V_{YT}$ having a non-resonant frequency of 60 Hz and a peak-to-peak voltage of 60V, and a combined saw-tooth voltage generating unit 206 for generating a digital combined saw-tooth voltage $V_{YC}$. Each of the generating units 204, 205 and 206 has a memory such as a nonvolatile memory for storing the digital search sinusoidal-wave voltage $V_{YS}$, the digital saw-tooth voltage $V_{YT}$ or the digital combined saw-tooth voltage $V_{YC}$. One of the digital search sinusoidal-wave voltage $V_{YS}$, the digital saw-tooth voltage $V_{YT}$ and the digital combined saw-tooth voltage $V_{YC}$ is selected by a selector 207 and is converted by a digital-to-analog converter 208 into an analog drive voltage $V_{Y1}$ for the pads $P_{Y1}a$ and $P_{Y1b}$. Also, an inverter 209 generates an inverted analog drive voltage $V_{Y2}$ of the drive voltage $V_{Y1}$ for the pads $P_{Y2}a$ and $P_{Y2b}$.

Further, the drive 20 is constructed by an analog-to digital converter 210 for converting an analog sense voltage $V_s$ sensed by the piezoelectric sensor 6a-s into a digital sense voltage $V_s$. Note that the denotation of the digital sense voltage is the same as that of the analog sense voltage, in order to simplify the description.

The sinusoidal-wave voltage generating unit 201, the search sinusoidal-wave voltage generating unit 204, the saw-tooth voltage generating unit 205, the combined saw-tooth voltage generating unit 206 and the selector 207 are controlled by a control unit 211 which receives the digital sense voltage $V_s$ from the analog-to-digital converter 210.

In FIG. 5, if only one of the search sinusoidal-wave generating unit 204, the saw-tooth voltage generating unit 205 and the combined saw-tooth voltage generating unit 206 is selectively operated, the selector 207 would be unnecessary.

The control unit 211 is constructed by a digital signal processor (DSP), a field programmable gate array (FPGA) or the like.

Figure 6:
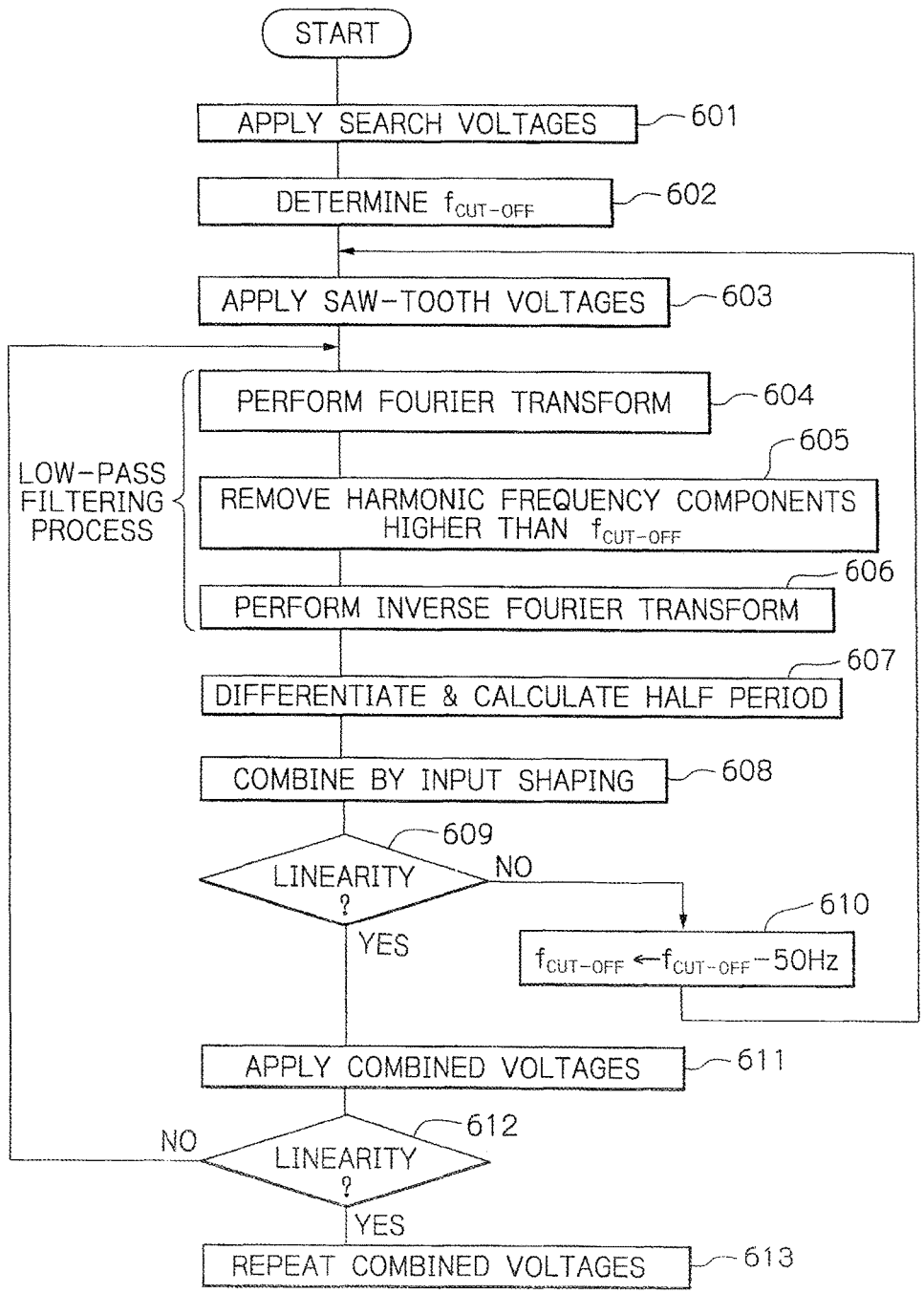
FIG. 6 is a flowchart for explaining the operation of the control unit of FIG. 5.

The operation of the control unit 211 regarding the drive voltages $V_{Y1}$ and $V_{Y2}$ and the sense voltage $V_S$ will be explained with reference to a flowchart as illustrated in FIG. 6. Note that the operation of the control unit 211 regarding the drive voltages $V_{X1}$ and $V_{X2}$ is omitted, since the presently disclosed subject matter does not relate to the drive voltages $V_{X1}$ and $V_{X2}$.

The operation illustrated by the flowchart of FIG. 6 is started by turning on the optical deflector of FIG. 1.

First, referring to step 601, the control unit 211 operates the search sinusoidal-wave voltage generating unit 204 along with the selector 207. Therefore, the search sinusoidal-wave voltage generating unit 204 generates a digital search sinusoidal-wave voltage $V_{YS}$ transmits it to the digital-to-analog converter 208. In this case, $$V_{Y1}=V_{YS}$$

$$V_{Y2}=/V_{YS}$$

Therefore, the piezoelectric actuators 6a and 6b are driven by the search sinusoidal-wave voltages $V_{YS}$ and/$V_{YS}$ to rock the mirror 1 around the Y-axis. In this case, the search sinusoidal-wave voltage $V_{YS}$ has a peak-to-peak voltage of 2V, much lower than 60V, thus preventing the optical deflector from being damaged by the resonance with the main natural frequency Fr and the pumping natural frequency Fp. The search sinusoidal-wave voltage $V_{YS}$ is swept from 1 Hz to 2 kHz or vice versa, preferably, from 60 Hz to 1100 Hz or vice versa, for example. As a result, a frequency spectrum of the sense voltage $V_S$ from the piezoelectric sensor 6a-s is obtained as illustrated in FIG. 7.

Next referring to step 602, a cut-off frequency $f_{CUT-OFF}$ is determined in accordance with the frequency spectrum of FIG. 7 obtained by step 601. In FIG. 7, since the main natural frequency Fr (=1080 Hz) and the pumping natural frequency Fp (=790 Hz) would greatly vibrate the mirror 1 to damage the optical deflector, the frequencies Fr and Fp are harmful and therefore, will be removed by a low-pass filtering process which will be explained with reference to steps 604, 605 and 606. Therefore, 600 Hz is initially set in the cut-off frequency $f_{CUT-OFF}$ for the low-pass filtering process.

Next, referring to step 603, the control unit 211 stops the operation of the search sinusoidal-wave voltage generating unit 204 and operates the saw-tooth voltage generating unit 205 along with the selector 207. Therefore, the saw-tooth voltage generating unit 205 generates a digital saw-tooth voltage $V_{YT}$ and transmits it to the digital-to-analog converter 208. In this case, $$V_{Y1}=V_{YT}$$

$$V_{Y2}=/V_{YT}$$

Figure 8A:
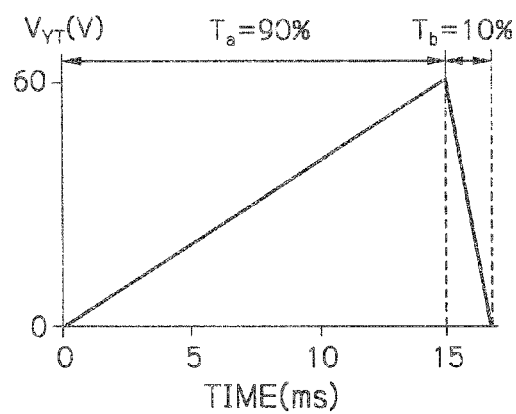
FIG. 8A is a timing diagram of the saw-tooth voltage generated by the saw-tooth voltage generating unit of FIG. 5.

Therefore, the piezoelectric actuators 6a and 6b are driven by the saw-tooth voltages $V_{YT}$ and/$V_{YT}$ to rock the mirror 1 around the Y-axis. In this case, as illustrated in FIG. 8A, the saw-tooth voltage $V_{YT}$ has a peak-to-peak voltage of 60V with a frequency of 60 Hz. In FIG. 8A, a ratio of Ta/Tb is 9/1 where Ta is called an image active period and Tb is called a blanking period.

Next, referring to steps 604, 605 and 606, a low-pass filtering process using the cut-off frequency $f_{CUT-OFF}$ is performed upon the sense voltage $V_S$ of the piezoelectric sensor 6a-s. Concretely, at step 604, a Fourier transform is performed upon the sense voltage $V_S$ of the piezoelectric sensor 6a-s to obtain a Fourier frequency spectrum. Then, at step 605, harmonic frequency components higher than the cut-off frequency $f_{CUT-OFF}$ are removed from the Fourier frequency spectrum to obtain a modified Fourier frequency spectrum. Then, at step 606, an inverse-Fourier transform is performed upon the modified Fourier frequency spectrum to obtain a low-pass-filtered saw-tooth voltage $V_{YT}'$ as illustrated in FIG. 8B.

Figure 8C:
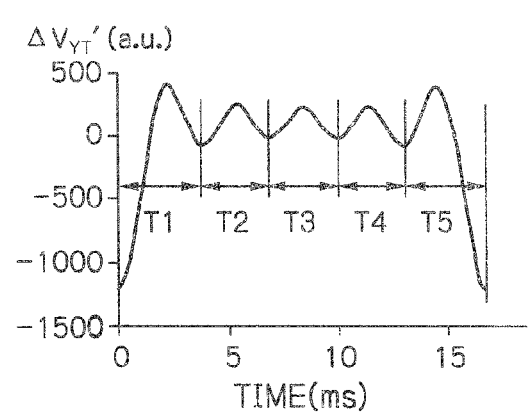
FIG. 8C is a timing diagram of the differential voltage generated by the flowchart of FIG. 6.
Figure 8B:
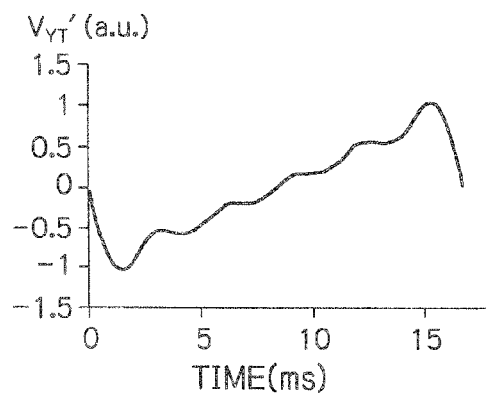
FIG. 8B is a timing diagram of a low-pass-filtered saw-tooth voltage generated by the flowchart of FIG. 6.

Next, referring to step 607, the control unit 211 differentiates the low-pass-filtered saw-tooth voltage $V_{YT}'$ as illustrated in FIG. 8B to obtain a differential voltage $\Delta V_{YT}'$ as illustrated in FIG. 8C. Then, the control unit 211 calculates a half period HP of fluctuations of the differential voltage $\Delta V_{YT}'$ of FIG. 8C. In FIG. 8C, when the differential voltage $\Delta V_{YT}'$ is larger than a predetermined level "0", five fluctuations whose periods are defined by T1, T2, T3, T4 and T5 occur. Then, an average half period HP is calculated by $$HP=[(T1+T2+T3+T4+T5)/5]/2$$

$$=[17 \text{ ms}/5]/2$$

$$\approx 1.7 \text{ ms}.$$

Figure 8D:
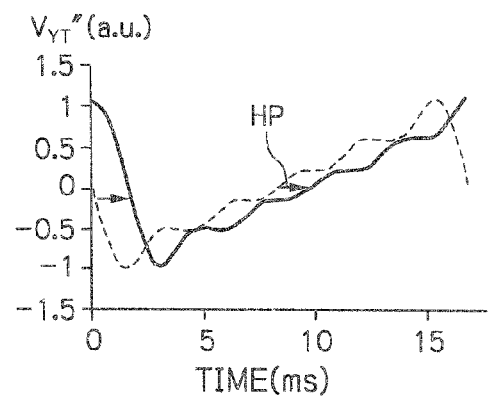
FIG. 8D is a timing diagram of the delayed low-pass-filtered saw-tooth voltage generated by the flowchart of FIG. 6.

Next, referring to step 608, the control unit 211 delays the low-pass-filtered saw-tooth voltage $V_{YT}'$ of FIG. 8B by the half period HP to obtain a delayed low-pass-filtered saw-tooth voltage $V_{YT}''$ as illustrated in FIG. 8D. Then, the control unit 211 combines (synthesizes) the low-pass-filtered saw-tooth voltage $V_{YT}'$ of FIG. 8B with the delayed low-pass-filtered saw-tooth voltage $V_{YT}''$ to obtain a combined (synthesized) saw-tooth voltage $V_{YC}$ as illustrated in FIG. 8E by $$V_{YC} \leftarrow (V_{YT}'+k \cdot V_{YT}'')/(1+k)$$

where k is a positive constant not larger than 1 (0<k≤1).

Figure 8E:
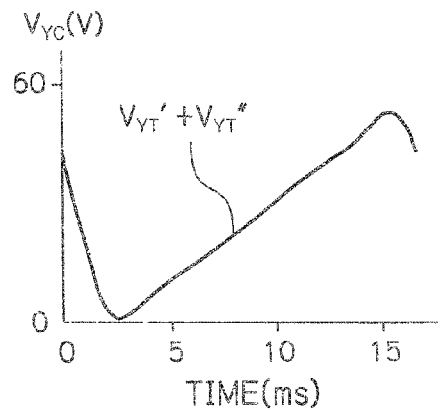
FIG. 8E is a timing diagram of the combined saw-tooth voltage generated by the flowchart of FIG. 6.

In the combined saw-tooth voltage $V_{YC}$ as illustrated in FIG. 8E, the fluctuation of the low-pass-filtered saw-tooth voltage $V_{YT}'$ as illustrated in FIG. 8B is compensated for by the fluctuation of the delayed low-pass-filtered saw-tooth voltage $V_{YT}''$ as illustrated in FIG. 8D. This is a so-called input shaping process.

Next, referring to step 609, it is determined whether or not the linearity characteristic of the combined saw-tooth voltage $V_{YC}$ satisfies a first predetermined condition. Ideally, the combined saw-tooth voltage $V_{YC}$ should have a complete linear characteristic as indicated by a straight line SL in FIG. 9; however, actually the combined saw-tooth voltage $V_{YC}$ still has fluctuations as indicated by shaded areas F in FIG. 9. Therefore, the control unit 211 calculates the shaded areas F of the combined saw-tooth voltage $V_{YC}$ deviated from the straight line SL in FIG. 9, and determines whether or not a ratio of the shaded areas F to a double-hatched triangular saw-tooth area below the straight line SL is smaller than a predetermined value such as 2.5%. If the ratio of the shaded areas F to the double-hatched triangular saw-tooth area is not smaller than the predetermined value, the control unit 211 determines that there are still fluctuations to be compensated for in the combined saw-tooth voltage $V_{YC}$, the control proceeds to step 610 which decreases the cut-off frequency $f_{CUT\text{-}OFF}$ by a definite value such as 50 Hz, i.e., $$f_{CUT\text{-}OFF} \leftarrow f_{CUT\text{-}OFF} - 50 \text{ Hz}$$

Then, the control returns to step 603 to repeat the above-mentioned processes at step 603 to 608, thus renewing the combined saw-tooth voltage $V_{YC}$.

On the other hand, if the ratio of the shaded areas to the double-hatch triangular saw-tooth area is smaller than the predetermined value, the control unit 211 determines that there are no substantial fluctuations to be compensated for in the combined saw-tooth voltage $V_{YC}$, so that the control proceeds to step 611.

Referring to step 611, the control unit 211 stops the operation of the saw-tooth voltage generating unit 205 and operates the combined saw-tooth voltage generating 206 along with the selector 207. Therefore, the combined saw-tooth voltage generating unit 205 generates a digital combined saw-tooth voltage $V_{YC}$ and transmits it to the digital-to-analog converter 208. In this case, $$V_{Y1} = V_{YC}$$

$$V_{Y2} = /V_{YC}$$

Therefore, the piezoelectric actuators 6a and 6b are driven by the combined saw-tooth voltages $V_{YC}$ and $/V_{YC}$ to rock the mirror 1 around the Y-axis. In this case, as illustrated in FIG. 10 similar to FIG. 9, the sensor voltage $V_S$ has a voltage similar to the combined saw-tooth voltage $V_{YC}$ with a frequency of 60 Hz.

Next, referring to step 612, it is determined whether or not the linearity characteristic of the sense voltage $V_S$ satisfies a second predetermined condition. Even in this case, ideally, the sense voltage $V_s$ should have a complete linear characteristic as indicated by a straight line SL' in FIG. 10; however, actually the sense voltage $V_S$ still has fluctuations as indicated by shaded areas F' in FIG. 10. Therefore, the control unit 211 calculates the shaded areas F' of the sense voltage $V_S$ deviated from the straight line SL' in FIG. 10, and determines whether or not a ratio of the shaded areas F' to a double-hatched triangular saw-tooth area below the straight line SL' is smaller than a predetermined value such as 2.5%. If the ratio of the shaded areas F' to the double-hatched triangular saw-tooth area is not smaller than the predetermined value, the control unit 211 determines that there are still fluctuations to be compensated for in the sense voltage $V_S$, so that the control returns to step 604 to repeat the above-mentioned processes at step 604 to 611, thus renewing the combined saw-tooth voltage $V_{YC}$.

On the other hand, if the ratio of the shaded areas F' to the double-hatched triangular saw-tooth area is smaller than the predetermined value, the control unit 211 determines that there are no substantial fluctuations to be compensated for in the sense voltage $V_S$, so that the control proceeds to step 613. Thus, the application of the current combined saw-tooth voltage $V_{YC}$ maintained.

Figure 11:
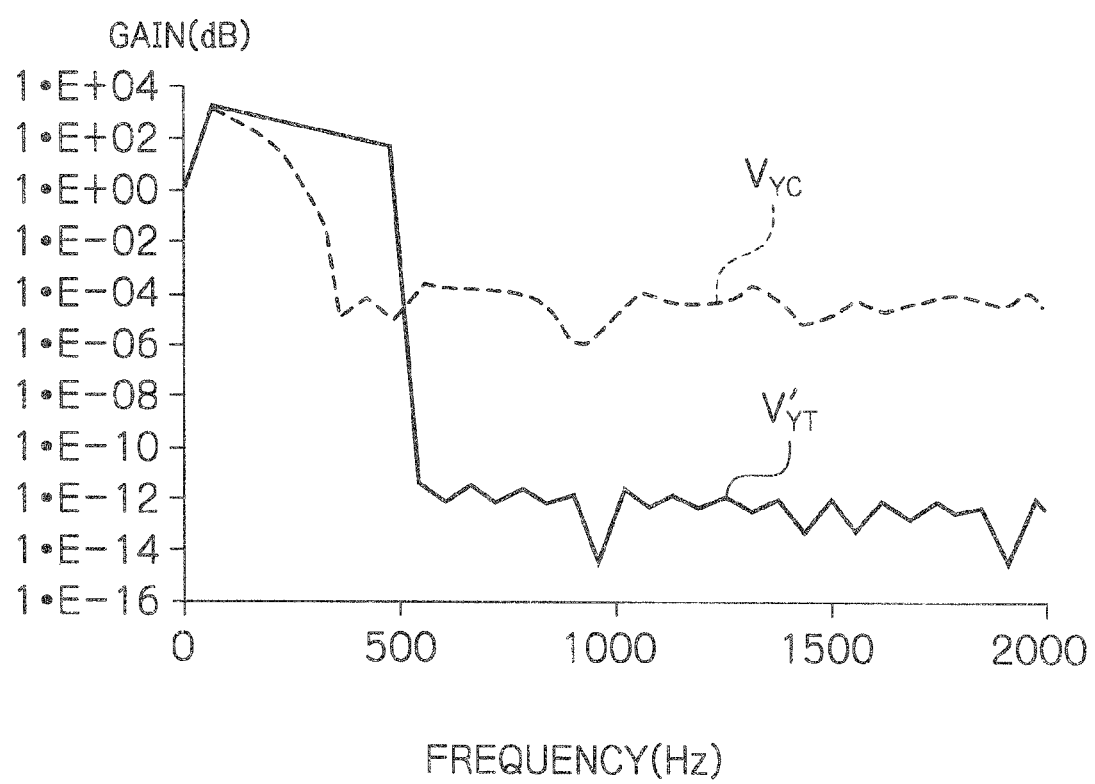
FIG. 11 is a frequency spectrum diagram of the saw-tooth voltage of FIG. 8A and the combined saw-tooth voltage of FIG. 8E.

According to the operation according to the flowchart of FIG. 6, as illustrated in FIG. 11, the gain of the low-pass-filtered saw-tooth voltage $V_{YT}'$ where frequency components larger than 600 Hz are removed from the saw-tooth voltage $V_{YT}$ is decreased in a frequency region whose frequency is larger than 600 Hz. Contrary to this, the gain of the combined saw-tooth voltage V increased $10^2$ times that of the low-pass-filtered saw-tooth voltage $V_{YT}'$. That is, the combined saw-tooth voltage $V_{YC}$ than the low-pass-filtered saw-tooth voltage $V_{YT}'$ is brought close to the saw-tooth voltage $V_{YT}$ by the above-mentioned increase of the gain.

Figure 12A:
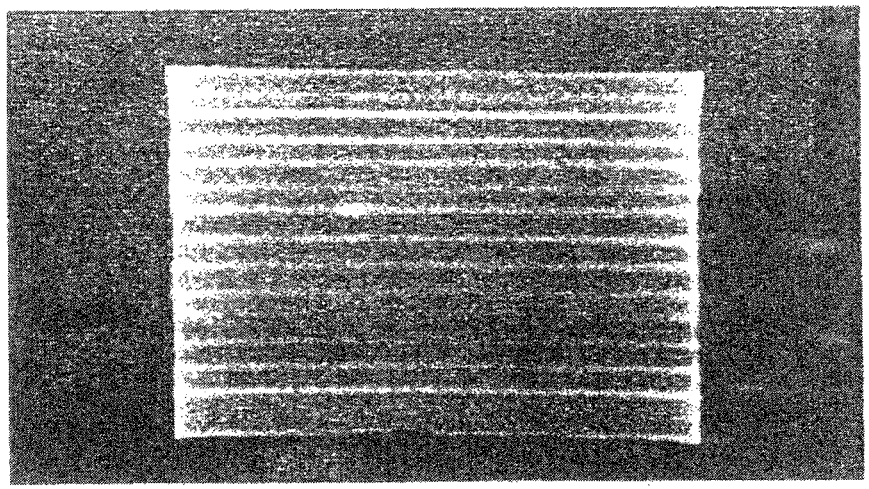
FIG. 12A is a photograph showing an image obtained by driving the outer piezoelectric actuators of FIG. 1 using the low-pass-filtered saw-tooth voltages of FIG. 8A.
Figure 12B:
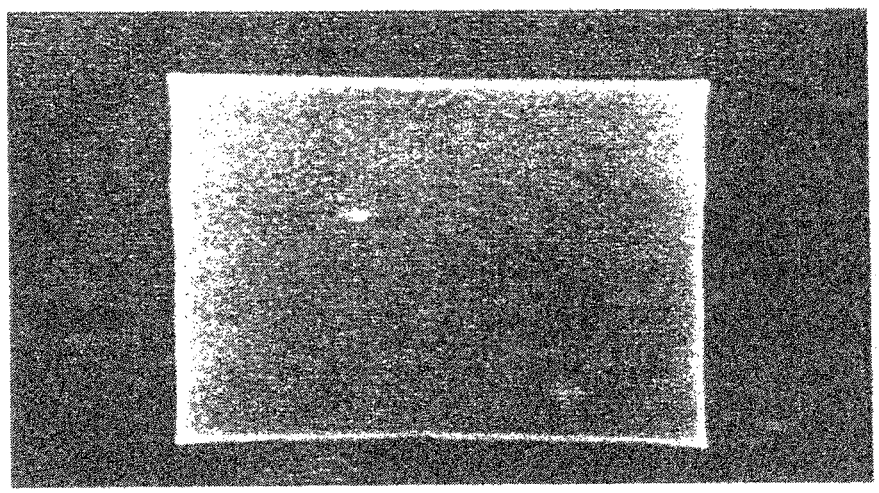
FIG. 12B is a photograph showing an image obtained by driving the outer piezoelectric actuators of FIG. 1 using the combined saw-tooth voltages of FIG. 8E.

When the inner piezoelectric actuators 4a and 4b were driven by the resonant sinusoidal-wave drive voltages $V_{X1}$ and $V_{X2}$ as illustrated in FIGS. 3A and 3B and the outer piezoelectric actuators 6a and 6b by the non-resonant low-pass-filtered saw-tooth voltage $V_{YT}'$ as illustrated in FIG. 8B and its inverted voltage, to reflect white light L from the light source 30, an image as illustrated in FIG. 12A was obtained to exhibit traverse stripes due to the fluctuations in the low-pass-filtered saw-tooth voltage $V_{YT}'$. Contrary to this, when the inner piezoelectric actuators 4a and 4b were driven by the resonant sinusoidal-wave drive voltages $V_{X1}$ and $V_{X2}$ as illustrated in FIGS. 3A and 3B and the outer piezoelectric actuators 6a and 6b by the non-resonant combined saw-tooth voltage $V_{YC}$ illustrated in FIG. 8E and its inverted voltage, to reflect white light L from the light source 30, an image as illustrated in FIG. 12B was obtained to exhibit no traverse stripes due to no substantial fluctuations in the combined saw-tooth Voltage $V_{YC}$.

Figure 13A:
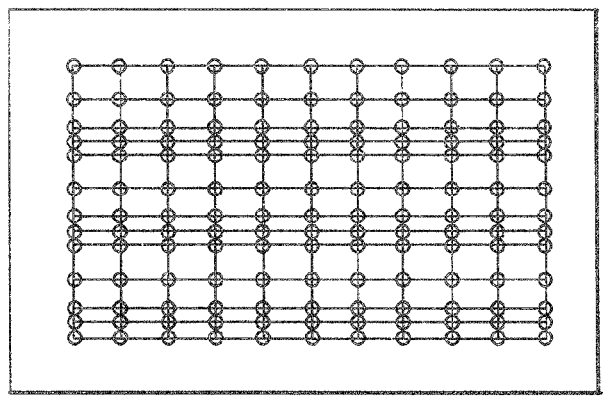
FIGS. 13A, 13B and 13C are diagrams for explaining the ringing phenomena of the light spots on an image frame scanned with the light of the optical deflector of FIG. 1.
Figure 13B:
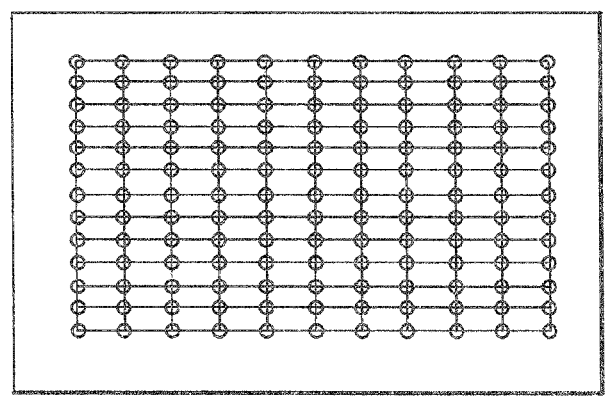
Figure 13C:
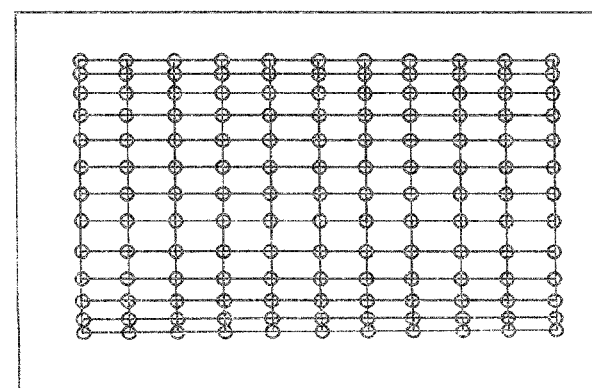

FIGS. 13A, 13B and 13C are diagrams for showing ringing phenomena of light spots on an image frame scanned with the light L of the optical deflector of FIG. 1 which is lit at a definite time period.

As illustrated in FIG. 13A, when the inner piezoelectric actuators 4a and 4b are driven by the resonant sinusoidal-wave voltages $V_{X1}$ and $V_{X2}$ while the outer piezoelectric actuators 6a and 6b are driven by the low-pass-filtered saw-tooth voltage $V_{YT}'$ of FIG. 8B and its inverted voltage $/V_{YT}'$, the light spots are non-uniform in the vertical direction, so that the ringing phenomenon of the light spots in the vertical direction is large.

Also, as illustrated in FIG. 13B, when the inner piezoelectric actuators 4a and 4b are driven by the resonant sinusoidal-wave voltages $V_{X1}$ and $V_{X2}$ while the outer piezoelectric actuators 6a and 6b are driven by the combined saw-tooth voltage $V_{YC}$ and its inverted voltage $/V_{YC}$, the spots are uniform in the vertical direction, so that there is no substantial ringing phenomenon of the light spots in the vertical direction. Also, an effective image active ratio in the vertical direction is almost 90%.

Further, as illustrated in FIG. 13C, when the inner piezoelectric actuators are driven by the resonant sinusoidal-wave voltages $V_{X1}$ and $V_{X2}$ while the outer piezoelectric actuators 6a and 6b are driven by a non-resonant sinusoidal-wave voltage and its inverted voltage, the light spots in the upper-vertical direction and the lower-vertical direction are tight while the light spots in the middle vertical direction are coarse. Thus, an effective image active ratio in the vertical direction is about 50%.

In the above-described embodiment, the piezoelectric sensor 6a-s is incorporated into the piezoelectric cantilever 6a-1 of the piezoelectric actuator 6a; however, the piezoelectric sensor 6a-s can be provided at another portion of the optical deflector such as the outer frame 5.

Also, in the above-described embodiment, the piezoelectric actuators 6a and 6b are provided; however, only one of the piezoelectric actuators 6a and 6b can be provided.

Figure 14:
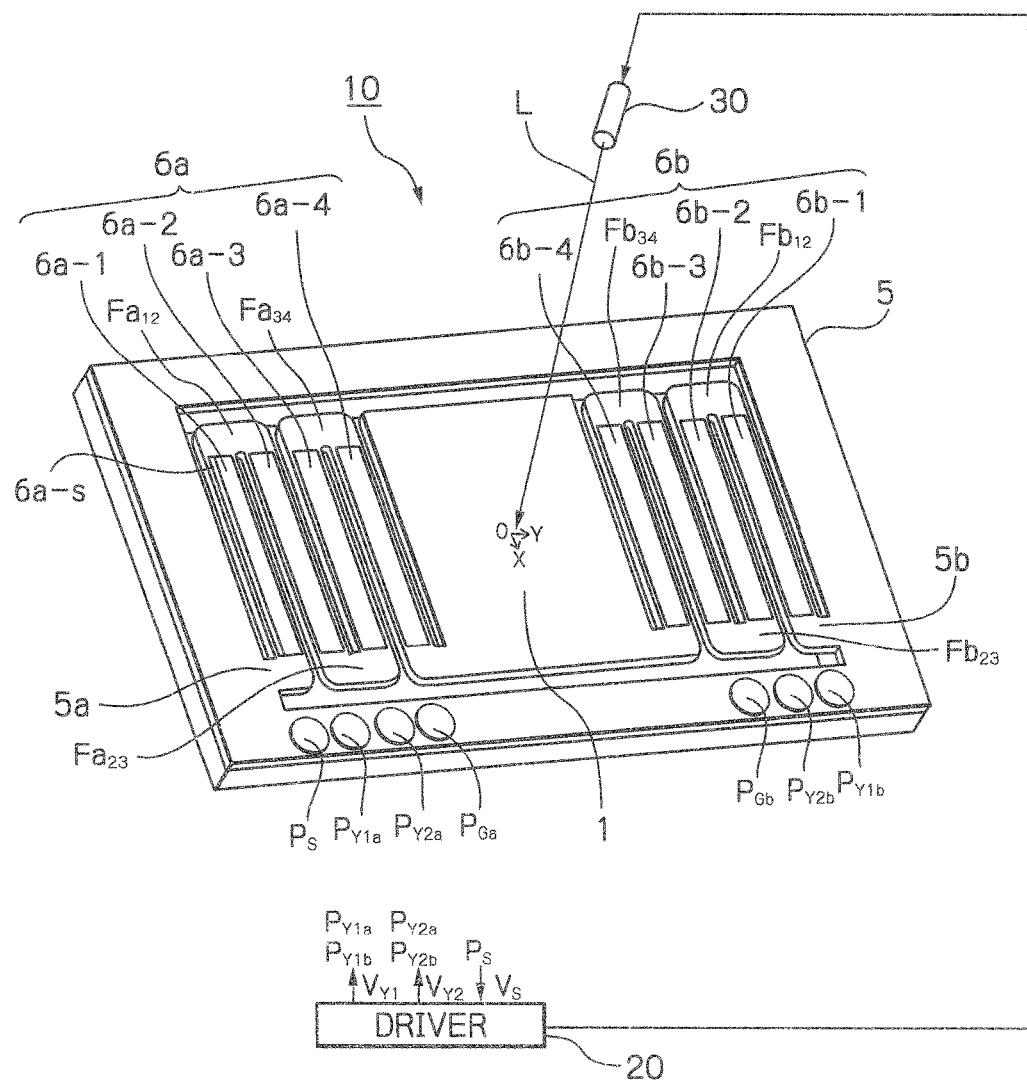
FIG. 14 is a front-side perspective view illustrating a modification of the optical deflector of FIG. 1.

Further, the presently disclosed subject matter can be applied to a one-dimensional optical deflector as illustrated in FIG. 14.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A driver for driving an optical deflector including a mirror, a piezoelectric actuator adapted to rock said mirror around a first axis of said optical deflector, and a piezoelectric sensor adapted to sense vibrations of said piezoelectric actuator, said driver comprising:
    a saw-tooth voltage generating unit adapted to generate a saw-tooth voltage;
    a combined saw-tooth voltage generating unit adapted to generate a combined saw-tooth voltage; and
    a control unit adapted to control said saw-tooth voltage generating unit and said combined saw-tooth voltage generating unit to receive a sense voltage from said piezoelectric sensor,
    wherein said control unit: operates said saw-tooth voltage generating unit to apply said saw-tooth voltage and its inverted voltage to said piezoelectric actuator to receive said sense voltage from said piezoelectric sensor;
    performs a low-pass filtering process using a cut-off frequency upon said sense voltage to obtain a low-pass-filtered saw-tooth voltage;
    calculates a half period of fluctuations included in said low-pass-filtered saw-tooth voltage;
    combines said low-pass-filtered saw-tooth voltage with a delayed low-pass-filtered saw-tooth voltage obtained by delaying said low-pass-filtered saw-tooth voltage by said half period, to obtain said combined saw-tooth voltage; and
    operates said combined saw-tooth voltage generating unit to apply said combined saw-tooth voltage and its inverted voltage to said piezoelectric actuator.

2. The driver as set forth in claim 1, wherein said control unit:
    calculates a first linearity characteristic of said sense voltage while applying said saw-tooth voltage and its inverted voltage to said piezoelectric actuator;
    determines whether or not said first linearity characteristic of said sense voltage satisfies a first predetermined condition; and
    continues application of said saw-tooth voltage and its inverted voltage to said piezoelectric actuator to renew said combined saw-tooth voltage by decreasing said cut-off frequency by a predetermined amount, until said first linearity characteristic of said sense voltage satisfies said first predetermined condition.

3. The driver as set forth in claim 2, wherein said control unit:
    calculates a second linearity characteristic of said sense voltage while applying said combined saw-tooth voltage and its inverted voltage to said piezoelectric actuator;
    determines whether or not said second linearity characteristic of said sense voltage satisfies a second predetermined condition; and
    renews said combined saw-tooth voltage until said second linearity characteristic of said Sense voltage satisfies said second predetermined condition.

4. The driver as set forth in claim 1, further comprising a search sinusoidal-wave voltage generating unit adapted to generate a search sinusoidal-wave voltage,
    wherein said control unit:
    operates said search sinusoidal-wave voltage generating unit to apply said search sinusoidal-wave voltage and its inverted voltage to said piezoelectric actuator while sweeping the frequency of said search sinusoidal-wave voltage to receive said sense voltage from said piezoelectric sensor; and
    initially determines said cut-off frequency of said low-pass-filtered process in accordance with said sense voltage from said piezoelectric sensor while applying said search sinusoidal-wave voltage and its inverted voltage to said piezoelectric actuator.

5. The driver as set forth in claim 1, wherein said piezoelectric actuator comprises a first group of piezoelectric cantilevers and a second group of piezoelectric cantilevers alternating with said first group of piezoelectric cantilevers folded at their ends and in parallel with a second axis perpendicular to said first axis, and
    wherein a voltage applied to said first group of piezoelectric cantilevers is opposite in phase to a voltage supplied to said second group of piezoelectric cantilevers.

6. The driver as set forth in claim 5, wherein said piezoelectric sensor is incorporated into one of said piezoelectric cantilevers.

7. A method for controlling an optical deflector including a mirror, a piezoelectric actuator adapted to rock said mirror around a first axis of said optical deflector, and a piezoelectric sensor adapted to sense vibrations of said piezoelectric actuator,
    said method comprising:
    applying a saw-tooth voltage and its inverted voltage to said piezoelectric actuator to receive said sense voltage from said piezoelectric sensor;
    performing a low-pass filtering process using, a cut-off frequency upon said sense voltage to obtain a low-pass-filtered saw-tooth voltage;
    calculating a half period of fluctuations included in said low-pass-filtered saw-tooth voltage;
    combining said low-pass-filtered saw-tooth voltage with a delayed low-pass-filtered saw-tooth voltage obtained by delaying said low-pass-filtered saw-tooth voltage by said half period, to obtain a combined saw-tooth voltage; and
    applying said combined saw-tooth voltage and its inverted voltage to said piezoelectric actuator.

8. The method as set forth in claim 7, further comprising:
    calculating a first linearity characteristic of said sense voltage while applying said saw-tooth voltage and its inverted voltage to said piezoelectric actuator;
    determining whether or not said first linearity characteristic of said sense voltage satisfies a first predetermined condition; and
    continuing application of said saw-tooth voltage and its inverted voltage to said piezoelectric actuator to renew said combined saw-tooth voltage by decreasing said cut-off frequency by a predetermined amount, until said first linearity characteristic of said sense voltage satisfies said first predetermined condition.

9. The method as set forth in claim 8, further comprising:
    calculating a second linearity characteristic of said sense voltage while applying said combined saw-tooth voltage and its inverted voltage to said piezoelectric actuator;
    determining whether or not said second linearity characteristic of said sense voltage satisfies a second predetermined condition; and
    renewing said combined saw-tooth voltage until said second linearity characteristic of said sense voltage satisfies said second predetermined condition.

10. The method as set forth in claim 7, further comprising:

applying a search sinusoidal-wave voltage and its inverted voltage to said piezoelectric actuator while sweeping the frequency of said search sinusoidal-wave voltage to receive said sense voltage from said piezoelectric sensor; and initially determining said cut-off frequency of said low-pass-filtered process in accordance with said sense voltage from said piezoelectric sensor while applying said search sinusoidal-wave voltage and its inverted voltage to said piezoelectric actuator.

11. The method as set forth in claim 7, wherein said piezoelectric actuator comprises a first group of piezoelectric cantilevers and a second group of piezoelectric cantilevers alternating with said first group of piezoelectric cantilevers folded at their ends and in parallel with a second axis perpendicular to said first axis, and wherein a voltage applied to said first group of piezoelectric cantilevers is opposite in phase to a voltage supplied to said second group of piezoelectric cantilevers.

12. The method as set forth in claim 11, wherein said piezoelectric sensor is incorporated into one of said piezoelectric cantilevers.

\* \* \* \* \*